US005644838A

United States Patent [19]
Beratan

[11] Patent Number: 5,644,838
[45] Date of Patent: Jul. 8, 1997

[54] METHOD OF FABRICATING A FOCAL PLANE ARRAY FOR HYBRID THERMAL IMAGING SYSTEM

[75] Inventor: Howard R. Beratan, Richardson, Tex.

[73] Assignee: Texas Instruments Incorporated, Dallas, Tex.

[21] Appl. No.: 368,066

[22] Filed: Jan. 3, 1995

[51] Int. Cl.$^6$ .................. H01L 21/84; H01L 31/0264; B05D 5/12; G01J 5/22
[52] U.S. Cl. .............. 29/840; 29/25.35; 29/847; 216/62; 250/332; 250/338.3; 250/338.4; 348/165; 430/313; 430/314; 430/329
[58] Field of Search .................. 29/25.35, 832, 29/840, 846, 847, 595; 25/338.1, 338.2, 338.3, 338.4, 332; 427/100, 126.3; 216/62; 228/180.1, 180.21; 348/165; 430/313, 314, 327, 329

[56] References Cited

U.S. PATENT DOCUMENTS

| | | | |
|---|---|---|---|
| 3,846,820 | 11/1974 | Lampe et al. | 250/338.3 X |
| 4,018,608 | 4/1977 | Frazier | 430/349 X |
| 4,080,532 | 3/1978 | Hopper | 250/332 |
| 4,142,207 | 2/1979 | McCormack et al. | 348/165 |
| 4,143,269 | 3/1979 | McCormack et al. | 250/332 X |
| 4,162,402 | 7/1979 | Hopper | 250/332 |
| 4,205,227 | 5/1980 | Reed | 250/338.4 X |
| 4,275,302 | 6/1981 | Imbert et al. | 250/330 |
| 4,379,232 | 4/1983 | Hopper | 250/332 |
| 4,594,507 | 6/1986 | Elliott et al. | 250/332 X |
| 4,615,595 | 10/1986 | Hornbeck | 353/122 |
| 4,705,361 | 11/1987 | Frazier et al. | 350/355 |
| 4,710,732 | 12/1987 | Hornbeck | 359/291 |
| 4,751,387 | 6/1988 | Robillard | 250/331 |
| 4,815,199 | 3/1989 | Jenner et al. | 29/840 |
| 4,926,051 | 5/1990 | Turnbull | 29/832 X |
| 4,956,619 | 9/1990 | Hornbeck | 359/317 |
| 4,994,672 | 2/1991 | Cross et al. | 250/332 X |
| 5,010,251 | 4/1991 | Grinberg et al. | 250/332 |
| 5,021,663 | 6/1991 | Hornbeck | 250/338.4 X |
| 5,047,644 | 9/1991 | Meissner et al. | 250/332 |
| 5,051,591 | 9/1991 | Trotta et al. | 250/332 X |
| 5,058,250 | 10/1991 | Turnbull | 29/25.35 |
| 5,061,049 | 10/1991 | Hornbeck | 359/224 |
| 5,083,857 | 1/1992 | Hornbeck | 359/291 |
| 5,099,120 | 3/1992 | Turnbull | 250/338.2 |

(List continued on next page.)

FOREIGN PATENT DOCUMENTS

| | | |
|---|---|---|
| 0939943 | 1/1974 | Canada . |
| 2251952 | 7/1992 | United Kingdom . |
| 9116607 | 10/1991 | WIPO . |

OTHER PUBLICATIONS

Stanley Wolf, Richard N. Tauber, "Silicon Processing for the VLSI ERA, vol. 1; Process Technology" *Lattice Press*, Sunset Beach, California, pp. 57–58, 110–113.

R.A. Wodd, et al., "HIDAD—A Monolithic, Silicon, Uncooled Infrared Imaging Focal Plane Array," 16.5/Wood/HIDAD pp. 579–581.

J.F. Li, et al., "Temperature Sensitivity of the Reflectance Coefficient of SbSI," *Ferroelectr. Lett. Sect.* 1990, 12(1), 1–7.

J. Li, et al., "Temperature dependence of optical constants of $MoS_2$ for Pyrooptical Devices," *Appl. Opt.* 1991 (30(13) 1583–4.

*Primary Examiner*—Peter Vo
*Attorney, Agent, or Firm*—Brian A. Carlson; James C. Kesterson; Richard L. Donaldson

[57] ABSTRACT

A hybrid thermal imaging system (20, 120) often includes a focal plane array (30, 130), a thermal isolation structure (50, 150) and an integrated circuit substrate (60, 160). The focal plane array (30, 130) includes thermal sensitive elements (42, 142) formed from a pyroelectric film layer (82), such as barium strontium titanate (BST). One side of the thermal sensitive elements (42, 142) may be coupled to a contact pad (62, 162) disposed on the integrated circuit substrate (60, 160) through a mesa strip conductor (56, 150) of the thermal isolation structure (50, 150). The other side of the thermal sensitive elements (42, 142) may be coupled to an electrode (36, 136). The various components of the focal plane array (30, 130) may be fabricated from multiple heterogenous layers (74, 34, 36, 82, 84) formed on a carrier substrate (70).

10 Claims, 2 Drawing Sheets

U.S. PATENT DOCUMENTS

| | | | |
|---|---|---|---|
| 5,196,703 | 3/1993 | Keenan | 250/332 |
| 5,238,530 | 8/1993 | Douglas et al. | 216/62 |
| 5,264,326 | 11/1993 | Meissner et al. | 430/313 |
| 5,272,341 | 12/1993 | Micheli et al. | 427/126.3 X |
| 5,367,167 | 11/1994 | Keenan | 250/338.4 |
| 5,434,410 | 7/1995 | Kulwiicki | 250/338.3 |

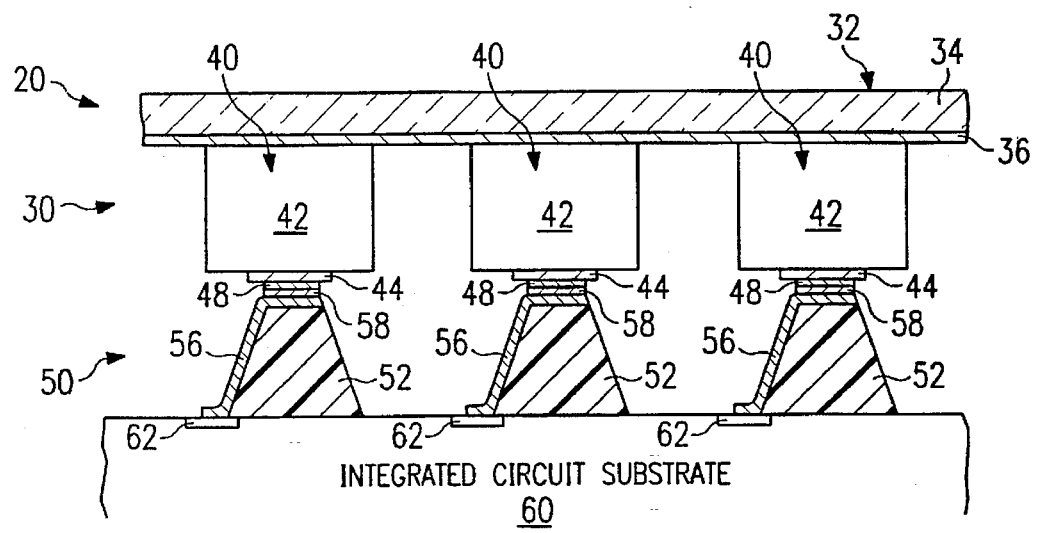
FIG. 1
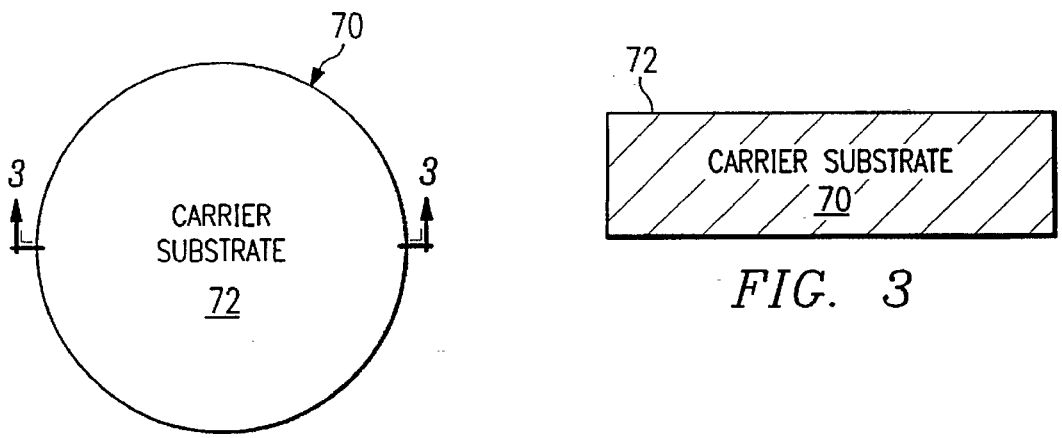
FIG. 2
FIG. 3
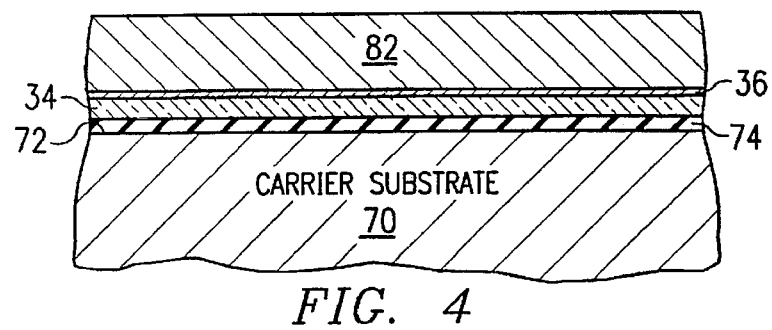
FIG. 4

METHOD OF FABRICATING A FOCAL PLANE ARRAY FOR HYBRID THERMAL IMAGING SYSTEM

RELATED APPLICATIONS

This application is related to copending application Ser. No. 08/229,497, entitled *Thermal Imaging System With Integrated Thermal Chopper and Method*, Attorney's Docket TI-18868 now U.S. Pat. No. 5,486,698, copending application Serial No. 08/281,711, entitled *Thermal Imaging System With A Monolithic Focal Plane Array*, Attorney's Docket TI-18817 now U.S. Pat. No. 5,512,748, and copending application Ser. No. 08/368,067, entitled *Monolithic Thermal Detector with Pyroelectric Film and Method*, Attorney's Docket TI-18822 now U.S. Pat. No. 5,602,043. These applications are assigned to the same assignee.

TECHNICAL FIELD OF THE INVENTION

This invention relates to a method for fabricating multiple heterogenous layers including a relatively thick pyroelectric film layer, and more particularly, to a hybrid thermal imaging system having an integrated circuit substrate with a thermal isolation structure coupled to a focal plane array formed from the multiple heterogenous layers.

BACKGROUND OF THE INVENTION

One common application for thermal sensors is in thermal (infrared) imaging device such as night vision equipment. One such class of thermal imaging devices includes a focal plane array of infrared detector elements or thermal sensors having pyroelectric material. The focal plane array and its associated thermal sensors are often coupled to an integrated circuit substrate with a corresponding array of contact pads and a thermal isolation structure disposed between the focal plane array and the integrated circuit substrate. The thermal sensors define the respective picture elements or pixels of the resulting thermal image.

One type of thermal sensor includes a thermal sensitive element formed from pyroelectric material which exhibits a state of electrical polarization and/or change in dielectric constant dependent upon temperature changes of the pyroelectric material in response to incident infrared radiation. An infrared absorber and common electrode assembly are often disposed on one side of the thermal sensitive elements. A sensor signal electrode is generally disposed on the opposite side of each thermal sensitive element. The infrared absorber and common electrode assembly typically extends across the surface of the focal plane array and is attached to the thermal sensitive elements. Each thermal sensitive element generally has its own separate sensor signal electrode. Each infrared detector element or thermal sensor may be defined in part by the infrared absorber and common electrode assembly and the respective sensor signal electrode. The common electrode and the sensor signal electrode constitute capacitive plates. The pyroelectric material constitutes a dielectric or insulator disposed between the capacitive plates.

For some thermal sensors barium strontium titanate (BST) may be used to form the thermal sensitive element for the resulting thermal sensors. The starting place for fabricating such thermal sensitive elements is typically a wafer of barium strontium titanate or other suitable pyroelectric material having a diameter of four inches and an approximate thickness of 0.1 inches. Various grinding and/or polishing processes are frequently used to reduce the thickness of the BST wafer to approximately 0.001 inches or less.

SUMMARY OF THE INVENTION

In accordance with the present invention, the disadvantages and problems associated with previous thermal imaging systems having thermal sensors formed from pyroelectric material have been substantially reduced or eliminated. The present invention allows fabricating a focal plane array for a hybrid thermal imaging system from multiple heterogenous layers including a relatively thick pyroelectric film layer. The resulting focal plane array and associated thermal sensors may be coupled with a thermal isolation structure disposed on an integrated circuit substrate using conventional bump bonding techniques or other techniques for fabricating hybrid solid state systems. One embodiment of the present invention may include fabricating an infrared absorber and common electrode assembly, thermal sensitive elements, and respective sensor signal electrodes using thin film preparation techniques associated with photolithography.

Important technical advantages of one embodiment may include growing a pyroelectric film having the desired thickness for use in fabricating thermal sensors for a thermal imaging system. The use of such pyroelectric film substantially reduces costs associated with polishing and grinding bulk pyroelectric materials to produce thermal sensitive elements having the desired thickness. By growing a layer of pyroelectric film with approximately the desired dimensions for the resulting thermal sensors, both fabrication costs and waste of pyroelectric material are substantially reduced. One aspect of the present invention includes eliminating the need for reticulation by laser or ion milling of pyroelectric material to produce the desired thermal sensitive elements.

Another aspect of the present invention includes growing a layer of pyroelectric film on a carrier substrate which is chemically compatible with the pyroelectric film. One or more separation layers may be disposed between the substrate and the pyroelectric film layer. Depending upon the sensor signal flow path associated with the resulting thermal sensor one or more layers of electrically conductive material may also be disposed on the pyroelectric film layer. For some applications, a layer of infrared absorbing material may be formed on the substrate prior to growing the pyroelectric film layer. The resulting multiple layers of infrared absorbing material, pyroelectric film and electrically conductive material may be processed using various etching and/or photolithographic techniques to produce a focal plane array having a plurality of thermal sensors for coupling with an integrated circuit substrate and it associated thermal isolation structure.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a schematic representation in elevation and in section with portions broken away of a hybrid thermal imaging system having a focal plane array formed from multiple heterogenous layers incorporating one embodiment of the present invention and an integrated circuit substrate with a thermal isolation structure disposed therebetween;

FIG. 2 is a plan view of a carrier substrate satisfactory for growing a pyroelectric film layer and other heterogenous layers associated with the focal plane array of FIG. 1 in accordance with one aspect of the present invention;

FIG. 3 is a drawing in section taken along lines 3—3 of FIG. 2;

FIG. 4 is a schematic representation in section with portions broken away showing the pyroelectric film layer and other layers associated with the focal plane array of FIG. 1 as grown on the substrate of FIGS. 2 and 3;

DETAILED DESCRIPTION OF THE INVENTION

Figure 5:
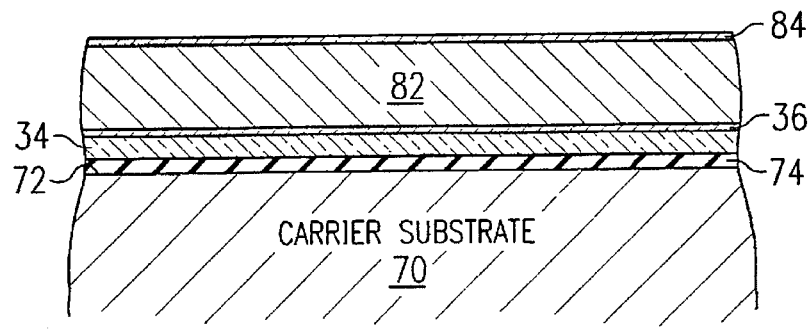
FIG. 5 is a schematic representation in section with portions broken away showing an additional layer of electrically conductive material disposed on the pyroelectric film layer of FIG. 4.

The embodiments of the present invention and its advantages are best understood by referring to FIGS. 1 through 7 of the drawings, like numerals being used for like and corresponding parts of the various drawings.

Some infrared detectors and thermal imaging systems are based upon either the generation of a change in voltage due to a change in temperature resulting from incident infrared radiation striking a thermal sensor or the generation of a change in voltage due to a photon-electron interaction within the material used to form the thermal sensor. This latter effect is sometimes called the internal photoelectric effect. Other infrared detectors and thermal imaging systems are based upon the change in resistance of a thin conductor caused by the heating effect of incident infrared radiation. Such infrared detectors are sometimes referred to as bolometers.

Thermal imaging systems constructed in accordance with the teachings of the present invention preferably function based upon the generation of a change in voltage due to a change in temperature of pyroelectric material resulting from incident infrared radiation. However, the present invention may be used with other types of thermal imaging systems including bolometers.

Thermal imaging systems or infrared detectors 20 and 120, which will be described later in more detail, may sometimes be referred to as uncooled infrared detectors. The various components of thermal imaging systems 20 and 120 are preferably contained within an associated housing (not shown) in a vacuum environment. Alternatively an environment of low thermal conductivity gas may be satisfactory for some applications.

Thermal imaging system 20 may be described as a hybrid solid state system formed by mounting focal plane array 30 with thermal isolation structure 50 on integrated circuit substrate 60. Focal plane array 30 preferably includes a plurality of thermal sensors 40. Focal plane array 30 may be both electrically and mechanically coupled with integrated circuit substrate 60 by thermal isolation structure 50 to produce a thermal image in response to incident infrared radiation striking focal plane array 30.

The components of focal plane array 30 include infrared absorber and common electrode assembly 32 and a plurality of thermal sensors 40. Infrared absorber and common electrode assembly 32 may further comprise one or more layers of optical coating 34 forming a tuned cavity from dielectric material such as parylene or zirconium oxide ($ZrO_2$) and common electrode 36. For some applications layer 34 may include multiple layers depending upon the specific wavelength or wavelengths of infrared radiation that thermal sensors 40 are designed to detect.

Common electrode 36 may perform several important functions such as increasing the interaction of incident infrared radiation with optical coating 34. Common electrode 36 is preferably electrically conductive to form a portion of the sensor signal flowpath which supplies bias voltage to thermal sensors 40. Also, common electrode 36 preferably has low thermal conductivity to minimize transfer of heat energy between thermal sensitive elements 42 in each thermal sensor 40. Common electrode 36 may be formed from materials such as nickel chrome, ruthenium (Ru), ruthenium oxide ($RuO_2$), lanthanum strontium cobalt oxide (LSCO) or platinum which have appropriate values of thermal and electrical conductivity. The reflectivity of such metals also cooperates with optical coating 34 to enhance the absorption of incident infrared radiation. For other embodiments of the present invention, materials other than metal which have the desired characteristics of electrical and thermal conductivity may be used to form common electrode 36. The present invention is not limited to using only metal for common electrode 36.

Each thermal sensor 40 may include a thermal sensitive element 42 which is preferably formed from pyroelectric material. One side of each thermal sensitive element 42 is preferably attached to common electrode 36. Sensor signal electrodes 44 are attached to the opposite side of respective thermal sensitive elements 42. For some applications thermal sensitive elements 42 may be formed from pyroelectric material such as barium strontium titanate (BST).

Thermal isolation structure 50 includes a plurality of mesa-type structures 52 disposed on integrated circuit substrate 60 adjacent to respective contact pads 62. Thermal isolation structure 50 may be used to provide mechanical support during bonding of focal plane array 30 with integrated circuit substrate 60 and to thermally insulate focal plane array 30 from integrated circuit substrate 60. Also, thermal isolation structure 50 provides an electrical interface between each thermal sensor 40 in focal plane array 30 and integrated circuit substrate 60. The electrical interface allows integrated circuit substrate 60 to process signals based on incident infrared radiation detected by focal plane array 30.

Mesa strip conductor 56 provides a signal path between the top of each mesa-type structure 52 and the adjacent contact pad 62. Recommended materials for the mesa strip conductors 56 include nickel chrome (NiCr) and titanium and tungsten alloys as well as other conductive oxides.

Various types of semiconductor materials and integrated circuit substrates may be satisfactorily used with the present invention. U.S. Pat. No. No. 4,143,269 entitled *Ferroelectric Imaging System* provides information concerning infrared detectors fabricated from pyroelectric materials and a silicon switching matrix or integrated circuit substrate. Examples of previous thermal isolation structures are shown in U.S. Pat. No. 5,047,644 entitled *Polyimide Thermal Isolation Mesa for a Thermal Imaging System* to Meissner, et al. The fabrication techniques and the materials used in U.S. Pat. No. 5,047,644 may be used in fabricating thermal isolation structures 50 and 150.

Bump bonding techniques may be satisfactorily used to form metal bonds between focal plane array 30 and thermal isolation structure 50. For one embodiment of the present invention, bump bonding material 48 may be placed on each sensor signal electrode 44 and bump bonding material 58 may be placed on the top of each mesa strip conductor 56. Indium is one example of such bump bonding material.

The configuration of mesa-type structures 52 and the associated mesa strip conductors 56 are design choices, largely dependent upon thermal isolation and structural rigidity considerations. Alternative configurations for mesa-type structures 52 include mesas with sloping sidewalls and mesas with vertical sidewalls. Mesa-type structures 52 of the present invention, including the exemplary thermal isolation structure 50, for thermal imaging systems 20 and 120, may be fabricated using conventional photolithographic techniques.

Focal plane array 30 may be fabricated from multiple heterogenous layers formed on carrier substrate 70. One embodiment of the present invention includes combining a number of related techniques such as thin film growth, material formation, reticulation, and optical coating processes to provide multiple heterogeneous layers corresponding with the selected design and configuration of the resulting focal plane array. For some applications, only one or two layers of the desired focal plane are formed on carrier substrate 70. For other applications, all of the heterogenous layers for the desired focal plane array may be formed on carrier substrate 70.

The various techniques may be integrated to allow fabrication of a focal plane array on carrier substrate 70 using processes associated with the manufacture of very large scale integrated circuits. Material usage and overall process efficiency associated with fabricating a focal plane array may be substantially improved. For example, pyroelectric film layer 82 is preferably formed with approximately the same thickness as desired for thermal sensitive elements 42. Thus, the possibility of polishing damage associated with previous techniques used to form thermal sensitive elements from pyroelectric materials have been substantially reduced or eliminated.

Various techniques may be used to form thin film layers 74, 34, 36, 82 and 84 as shown in FIGS. 4 and 5. Often these techniques are divided into two groups—film growth by interaction of a vapor deposited species with an associated substrate and film formation by deposition without causing changes to the associated substrate. The first group of thin film growth techniques includes thermal oxidation and nitridation of single crystal silicon and polysilicon. The formation of silicides by direct reaction of a deposited metal and the substrate is also frequently included in this first group of thin film growth techniques.

The second group of thin film growth techniques may be further divided into three subclasses of deposition. The first subclass is often referred to as chemical vapor deposition (CVD) in which solid films are formed on a substrate by the chemical reaction of vapor phase chemicals which contain the desired constituents for the associated thin film layer. The second subclass is often referred to as physical vapor deposition (PVD) in which the desired thin film layer is physically dislodged from a source to form a vapor and transport it across a reduced pressure region to the substrate. The dislodged layer is then condensed to form the desired thin film layer. The third subclass typically involves coating the substrate with a liquid which is then dried to form the desired thin film layer. The formation of thin film layers by PVD includes such processes as sputtering, evaporation and molecular beam epitaxy. Spin coating is one of the most commonly used techniques for depositing liquids on a substrate to form a thin film layer.

Thin film layers may also be satisfactorily grown in accordance with the teachings of the present invention by using techniques such as dipping, vapor phase deposition by sputtering, and sol/gel or metal oxide decomposition (MOD) by spin coating. An important feature of the present invention includes selecting the desired process to establish the desired electrical and thermal characteristics for the resulting focal plane array 30.

Carrier substrate 70 may be formed from silicon, ceramic alumina, or other suitable materials which are both chemically and thermally compatible with the multiple heterogenous layers which will be formed on surface 72 carrier substrate 70. For the embodiment of the present invention shown in FIGS. 2–6, carrier substrate 70 is preferably formed from ceramic alumina.

A layer of refractory material such as silicon dioxide, magnesium oxide, or calcium oxide may be deposited on surface 72 of carrier substrate 70 to function as a release layer or separation layer which allows removing the resulting focal plane array 30 from carrier substrate 70. As shown in FIGS. 2–6, carrier substrate 70 may be formed from ceramic alumina and release layer or separation layer 74 formed from calcium oxide. For other embodiments of the present invention, carrier substrate 70 may be formed from silicon and release layer or separation layer 74 formed from silicon dioxide.

For some applications, one or more barrier layers (not shown) may be disposed between surface 72 of carrier substrate 70 and separation layer 74. Such barrier layers may be used to establish chemical and/or thermal compatibility between carrier substrate 70 and the various heterogeneous layers formed thereon. Separation layer 74 is preferably formed from a refractory oxide or other material which is soluble in an etchant different from the various etchants used to fabricate focal plane array 30 from the multiple heterogeneous layers formed on carrier substrate 70.

Figure 6:
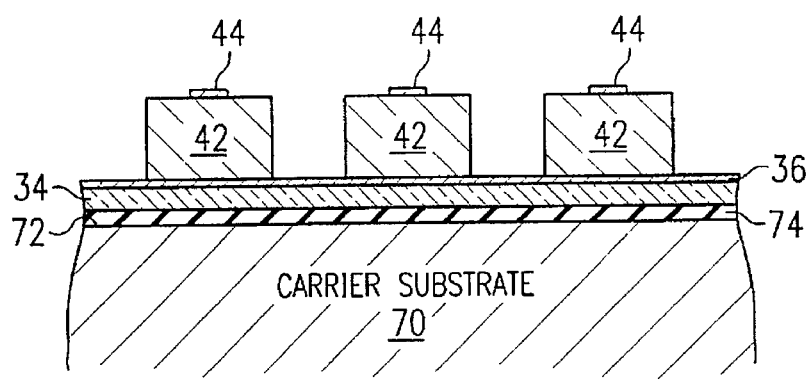
FIG. 6 is a schematic representation in section with portions broken away showing an intermediate step during fabrication of the focal plane array in FIG. 1.

For the embodiment of the present invention shown in FIGS. 4–6, optical coating layer 34 is preferably formed on separation layer 74. Various types of dielectric material such as zirconium dioxide may be used to form optical coating layer 34. The material selected to form optical coating layer 34 should preferably be stable during the various thermal and etching processes associated with fabricating focal plane array 30. The thickness of optical coating layer 34 may be adjusted based on the refractive index of the selected material. By varying the thickness and/or the type of material used to form optical coating layer 34, the resulting focal plane array 30 may be tuned to maximize absorption of incident infrared radiation over the desired spectrum. For some applications, a thin layer of semi-transparent metal (not shown) may be disposed between optical coating layer 34 and separation layer 74.

First layer 36 of electrically conductive material may next be deposited on optical coating layer 34. Various types of material such as nickel, nickel chrome, platinum, LSCO, ruthenium and/or ruthenium oxide may be used to form first electrically conductive layer 36. The type of electrically conductive material selected to form first layer 36 will depend upon both the desired electrical conductivity, thermal conductivity, and chemical compatibility with the materials used to form the other multiple heterogenous layers on carrier substrate 70 as desired for focal plane array 30. For the embodiment of the present invention shown in FIGS. 4–6, electrically conductive layer 36 may be formed from platinum.

Film layer 82 of the selected pyroelectric material may next be formed on electrically conductive layer 36. Various types of pyroelectric material such as lead barium strontium titanate, barium strontium titanate, lead titanate, lead lanthanum titanate, lead zirconate titanate, lead lanthanum zirconate titanate, lead strontium titanate, and lead scandium tantalate may be satisfactorily used depending upon the desired operating characteristics for the resulting focal plane array. For the embodiment of the present invention shown in FIGS. 4–6, pyroelectric film layer 82 is preferably formed from barium strontium titanate. As will be explained later in more detail, low concentrations of a second material may also be included with the barium strontium titanate to allow reducing the grain size at which the desired properties are obtained.

Various techniques may be used to form pyroelectric film layer 82. For the embodiment of the present invention shown in FIGS. 4–6, metal organic deposition and spin coating along the previous discussed thin film growth techniques may be used to form pyroelectric film layer 82 on first electrically conductive layer 36. In comparison with the other heterogeneous layers formed on carrier substrate 70 pyroelectric film layer 82 is relatively thick. The thickness of pyroelectric film layer 82 is selected to correspond approximately to the desired thickness for the resulting thermal sensitive elements 42. For some applications, thermal sensitive elements 42 will have a thickness of approximately 0.5 micron to 20 microns, depending upon the desired thermal characteristics or other compatible materials.

One aspect of the present invention may include the ability to form a relatively thick pyroelectric film layer 82 with controlled grain growth to achieve the desired pyroelectric properties for thermal sensitive elements 42. Pyroelectric film layer 82 may be formed on carrier substrate 70 using metal organic deposition techniques and liquid solution or salts containing barium strontium titanate. A source of lead (Pb) may be added to lower the processing temperature. Small granules of the same composition may also be added to form nucleation sites. The small granules will typically vary in size from one-half micron to two microns in diameter. The upper limit of two microns is based upon the desired thermal and electrical characteristics associated with the resulting grained structure. Depending upon the type of material selected to form pyroelectric film layer 82, the size of the small granules used to provide nucleation sites may be varied accordingly.

For some applications, additional doping materials may be included within the liquid barium strontium titanate to provide the desired operating characteristics for the resulting thermal sensitive elements 42. For other applications, pyroelectric film material may be formed by using metal organic deposition and spin coating techniques which include a mixture of the selected pyroelectric material in both liquid and powder form. The low concentrations of powder may be added to act as a nucleation site or seed to support the desired grain growth.

Large grains frequently require a higher annealing temperature for the associated film layer. By providing nucleation sites in the liquid solution, satisfactory grain size is achieved to produce the desired pyroelectric properties without requiring a high annealing temperature. By properly selecting the doping material and deposition rate, the annealing temperature for pyroelectric film layer 82 formed from barium strontium titanate may be reduced to between 300 to 800 degrees centigrade. Limiting the annealing temperature required for pyroelectric film layer 82, allows selecting a wider variety of materials to form the other heterogeneous layers on carrier substrate 70. As the annealing temperature required for pyroelectric film layer 82 increases, fewer materials are available to form layers 74, 34 and 36.

As best shown in FIG. 5, second layer 84 of electrically conductive material may next be deposited on pyroelectric film layer 82. Various types of materials such as nickel, nickel chrome, platinum, LSCO, ruthenium and/or ruthenium oxide may be used to form second electrically conductive layer 84. The type of electrically conductive material selected to form second layer 84 will depend upon both the desired electrical conductivity, thermal conductivity, and chemical compatibility with the materials used to form the other multiple heterogenous layers on carrier substrate 70. For the embodiment of the present invention shown in FIGS. 4–6, first electrically conductive layer 36 and second electrically conductive layer 84 may be formed from platinum.

During the process of forming multiple heterogenous layers 74, 34, 36, 82, and 84 on carrier substrate 70, one or more low temperature heat treatments may be applied at selected steps in the fabrication process. By applying a low temperature heat treatment (50° C. to 500° C.), solvents may be evolved from the various layers on carrier substrate 70 and some densification of the various layers will occur prior to reticulation of the individual thermal sensitive elements 42 and the final high temperature heat treatment of the selected pyroelectric material. The number of low temperature heat treatments may be varied depending upon the type of material selected for each layer 74, 34, 36, 82, and 84 along with the process used to form the respective layers on substrate 70.

Following formation on carrier substrate 70 of the multiple heterogenous layers for the desired focal plane array 30, various patterning and reticulation techniques may be used to provide the desired number and configuration of thermal sensors 40 associated with the resulting focal plane array 30. As best shown in FIGS. 5 and 6, etching techniques may be applied to second electrically conductive layer 84 to form sensor signal electrodes 44. Pyroelectric film layer 82 may then be etched with a different type of etchant to form thermal sensitive elements 42 associated with each thermal sensor 40. The type of etchant and etching process will depend upon the material in the respective layers 74, 34, 36, 82, and 84. Following fabrication of the desired thermal sensitive elements 42, an appropriate etchant may be applied to dissolve separation layer 74 and allow removal of the resulting focal plane array 30 from carrier substrate 70. Depending upon the particular fabrication processes being used, carrier substrate 70 may be removed from focal plane array 30 either before or after focal plane array 30 has been mounted on thermal isolation structure 50 of integrated circuit substrate 60.

Figure 7:
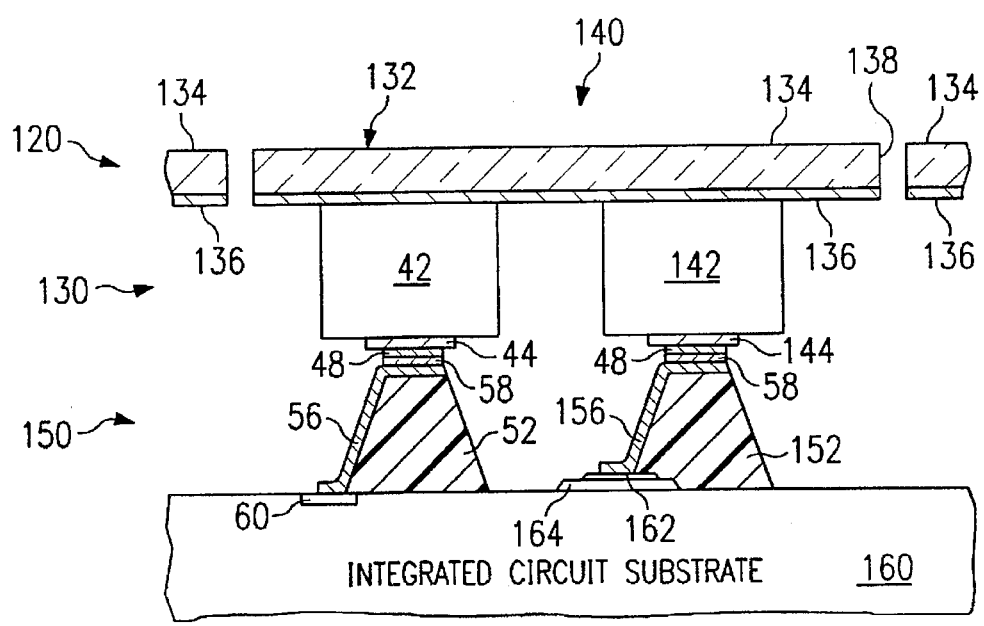
FIG. 7 is a schematic representation in elevation and in section with portions broken away of a hybrid thermal imaging system having a focal plane array formed from multiple heterogenous layers incorporating another embodiment of the present invention.

Thermal imaging system 120 shown in FIG. 7 may be described as a hybrid solid state system formed by mounting focal plane array 130 with thermal isolation structure 150 on integrated circuit substrate 160. Focal plane array 130 preferably includes a plurality of thermal sensors 140 which may be both electrically and mechanically coupled with integrated circuit substrate 160 by thermal isolation structure 150. Thermal imaging system 20 and 120 have many components in common. The principal differences between thermal imaging system 20 and 120 result from forming a plurality of slots 138 around the perimeter of each thermal sensor 140 to provide both thermal and electrical isolation between adjacent thermal sensors 140 in focal plane array 130.

Each thermal sensor 140 preferably includes an individual infrared absorber assembly 132 having one or more layers of optical coating 134 disposed on electrode 136. Optical coating 134 and electrode 136 may be formed on carrier substrate 70 using the same materials as previously described with respect to focal plane array 30. Since each thermal sensor 140 is isolated both electrically and thermally from adjacent thermal sensors 140, bias voltage must be supplied to each thermal sensor 140. For the embodiment of the present invention represented by thermal imaging system 120, integrated circuit substrate 160 preferably includes a common bus 164 which provides the desired bias voltage to each thermal sensor 140.

Each thermal sensor 140 preferably includes a pair of thermal sensitive elements 42 and 142 which may be formed from pyroelectric film layer 82 as previously described. Bias voltage may be supplied to each thermal sensor 140 through the respective contact pad 162, mesa strip conductor 156, bump bonding materials 58 and 48 to sensor signal electrode 144 attached to thermal sensitive element 42. The bias voltage may be supplied from thermal sensitive element 142 to thermal sensitive element 42 through electrode 136. Sensor signal electrode 44 and mesa strip conductor 56 are attached to thermal sensitive element 42 to provide a signal to integrated circuit substrate 60 in response to incident infrared radiation detected by the respective thermal sensor 140.

Focal plane array 130 may be formed on carrier substrate 70 using the fabrication techniques as previously described for focal plane array 30. When the fabrication process has reached the stage shown in FIG. 6, additional etchants may be applied to first electrically conductive layer 36 and optical coating layer 34 to form a plurality of slots 138 around the perimeter of each pair of thermal sensitive elements 42 and 142. The resulting focal plane array 130 with separate individual thermal sensors 140 may then be mounted on integrated circuit substrate 160.

The precise structural configuration and associated fabrication techniques for focal plane arrays 30 and 130 are dependent upon the application chosen for the respective thermal sensor 40 and 140. Even within a particular application, such as the exemplary thermal imaging systems 20 and 120, numerous design choices will be routinely implemented by those skilled in the art.

Although the present invention and its advantages have been described in detail, it should be understood that various changes, substitutions and alterations can be made therein without departing from the spirit and scope of the invention as defined by the appended claims.

What is claimed is:

1. A method of fabricating an array of thermal sensitive elements for use with a hybrid thermal imaging system, the method comprising the steps of:

forming a layer of optical coating on a carrier substrate;

forming a film layer of pyroelectric material on the optical coating layer by mixing particles with liquid pyroelectric material to provide nucleation sites for growing the film layer;

depositing a first layer of electrically conducting material between the optical coating layer and the pyroelectric film layer; and forming a second layer of electrically conducting material on the pyroelectric film layer opposite from the first layer of electrically conducting material; and patterning the pyroelectric film layer to form an array of thermal sensitive elements.

2. The method of claim 1 further comprising the steps of:

forming a separation layer of calcium oxide on the carrier substrate before forming said optical coating layer;

forming a film layer of barium strontium titanate on said first layer of electrically conducting material;

wherein said optical coating layer comprises material sensitive to infrared radiation and said first and second layers of electrically conducting material comprise platinum.

3. A method of fabricating an array of thermal sensitive elements for use with a hybrid thermal imaging system, the method comprising the steps of:

forming a film layer of pyroelectric material on a carrier substrate by mixing particles with liquid pyroelectric material to provide nucleation sites for growing the film layer; and patterning the pyroelectric film layer to form an array of thermal sensitive elements;

wherein the step of forming the pyroelectric film layer comprises the steps of:

using metal organic deposition and spin coating techniques to deposit liquid pyroelectric material on the carrier substrate;

mixing particles of a selected material with the liquid pyroelectric material to provide nucleation sites for grain growth of the pyroelectric material; and spinning the mixture of liquid and nucleation sites onto the carrier substrate to form the pyroelectric film layer.

4. A method of fabricating an array of thermal sensitive elements for use with a hybrid thermal imaging system, the method comprising the steps of:

forming a separation layer on a carrier substrate;

forming a layer of optical coating material on the separation layer;

forming a first layer of electrically conductive material on the optical coating layer;

forming a film layer of pyroelectric material on the first layer of electrically conductive material from a solution of liquid pyroelectric material and powder nucleation sites;

forming a second layer of electrically conductive material on the pyroelectric film layer opposite from the first layer of electrically conductive material; and patterning the pyroelectric film layer to form an array of thermal sensitive elements.

5. The method of claim 1 wherein the step of forming the film layer of pyroelectric material further comprises placing a liquid solution of the pyroelectrical material having small granules between approximately 0.5 micron and 2.0 microns in diameter on the carrier substrate.

6. The method of claim 4 further comprising the steps of:

removing portions of the second layer of electrically conductive material to form sensor signal electrodes for each of the respective thermal sensitive elements;

reticulating the pyroelectric film layer to form the desired pattern of thermal sensitive elements; and separating the array of thermal sensitive elements from the carrier substrate.

7. The method of claim 4 further comprising the steps of:

forming a layer of bump bonding material on the second layer of electrically conductive material;

removing portions of the bump bonding layer and the second layer of electrically conductive material to form sensor signal electrodes with bump bonding material disposed thereon for each of the respective thermal sensitive elements;

reticulating the pyroelectric film layer to form the desired array of thermal sensitive elements; and bonding the array with a thermal isolation structure projecting from an integrated circuit substrate using the bump bonding material on the sensor signal electrodes.

8. The method of claim 7 wherein the first layer and the second layer of electrically conductive material are selected from the group consisting of platinum, nickel chrome, ruthenium, ruthenium oxide and lanthanum strontium cobalt oxide.

9. The method of claim 4 further comprising the steps of:

removing portions of the second layer of electrically conducting material to form sensor signal electrodes for each of the respective thermal sensitive elements;

reticulating the film layer of pyroelectric material to form the desired array of thermal sensitive elements; and separating the array from the carrier substrate;

wherein said separation layer comprises calcium oxide and said first and second layers of electrically conducting material comprise platinum.

10. The method of claim 4 further comprising the steps of:

removing portions of the second layer of electrically conductive material to form sensor signal electrodes for each of the respective thermal sensitive elements;

reticulating the film layer of pyroelectric material to form the desired array of thermal sensitive elements.;

mounting the array on a thermal isolation structure projecting from a integrated circuit substrate; and separating the array from the carrier substrate;

wherein said separation layer comprises silicon dioxide.

* * * * *